(12) United States Patent
Chen et al.

(10) Patent No.: US 9,170,753 B2
(45) Date of Patent: Oct. 27, 2015

(54) EFFICIENT METHOD FOR MEMORY ACCESSES IN A MULTI-CORE PROCESSOR

(71) Applicant: Peking University, Beijing (CN)

(72) Inventors: Yifeng Chen, Beijing (CN); Weilong Cui, Beijing (CN); Xiang Cui, Beijing (CN)

(73) Assignee: Peking University, Beijing (CN)

( * ) Notice: Subject to any disclaimer, the term of this patent is extended or adjusted under 35 U.S.C. 154(b) by 160 days.

(21) Appl. No.: 14/143,252

(22) Filed: Dec. 30, 2013

(65) Prior Publication Data

US 2014/0351525 A1 Nov. 27, 2014

(51) Int. Cl.
*G06F 12/00* (2006.01)
*G06F 3/06* (2006.01)
*G06F 13/00* (2006.01)
*G06F 13/28* (2006.01)

(52) U.S. Cl.
CPC ............ *G06F 3/0658* (2013.01); *G06F 3/0604* (2013.01); *G06F 3/0671* (2013.01)

(58) Field of Classification Search
CPC .... G06F 3/0658; G06F 3/0604; G06F 3/0671
USPC .......................................................... 711/147
See application file for complete search history.

(56) References Cited

U.S. PATENT DOCUMENTS

| | | | | | |
|---|---|---|---|---|---|
| 5,386,579 | A | * | 1/1995 | Bourekas et al. | 712/43 |
| 6,044,412 | A | * | 3/2000 | Evoy | 710/14 |
| 6,778,463 | B2 | * | 8/2004 | Chen | 365/230.06 |
| 7,457,901 | B2 | * | 11/2008 | Gaskins | 710/107 |
| 2002/0184460 | A1 | * | 12/2002 | Tremblay et al. | 711/167 |
| 2010/0169889 | A1 | * | 7/2010 | Tsuji | 718/102 |

* cited by examiner

*Primary Examiner* — Mark Giardino, Jr.
(74) *Attorney, Agent, or Firm* — SV Patent Service

(57) ABSTRACT

A method of providing memory accesses for a multi-core processor includes reserving a group of pins of a multi-core processor to transmit either data or address information in communication with one or more memory chips, receiving memory access requests from the plurality of processor cores, determining granularity of the memory access requests by a memory controller, and dynamically adjusting the number of pins in the group of pins to be used to transmit address information based with the granularity of the memory access requests.

13 Claims, 7 Drawing Sheets

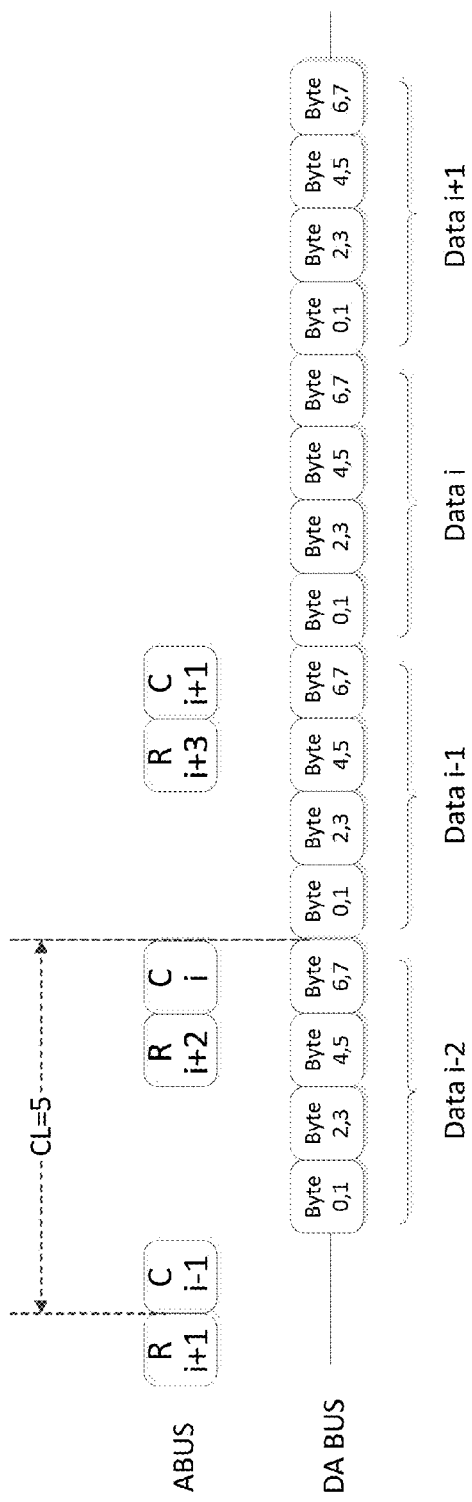
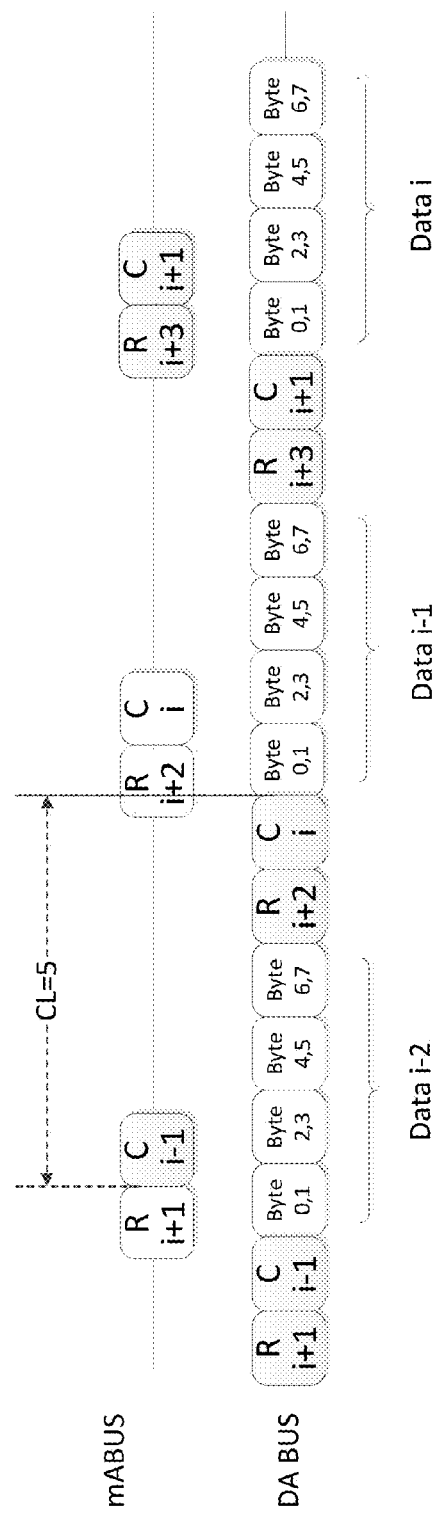
Figure 1A (Prior Art)
Figure 1B

EFFICIENT METHOD FOR MEMORY ACCESSES IN A MULTI-CORE PROCESSOR

BACKGROUND OF THE INVENTION

The present application relates to high-performance multi-purpose computer processors, and in particular, to processors that include internal memory controllers that control accesses to external memory chips.

The number of processor cores in a multi-core processor has increased rapidly in recent years. The computing performance of the multi-core processors is becoming increasingly limited by the bandwidths of the multi-core processors' accesses to external memory chips. Let P denotes the overall bandwidth (in GB/s) of data and address pins of the chip, D be the data bandwidth (in GB/s), and A be the bandwidth of address information (in GB/s), we have P=D+A. Given a fixed total number of data and address pins (i.e. constant P) and a clock rate, the D-to-A ratio is fixed in conventional processor architectures.

In some designs, data and address buses (and pins) are separated. If there is only a single memory controller, most pins are used for transferring data, and D is almost equal to P. For example, if there are 256 data pins connected to DDR3 chips (with consecutive data transmissions of burst length 8), the ideal granularity of memory accesses is 256 Bytes. Shorter memory accesses will not fully utilize the bandwidth. Most applications in cloud computing and transaction-processing use 4~8 bytes (integers and floats) per operation. For a computing task with mostly 8-byte accesses, data utilization is only 3% for such a single memory controller configuration.

Adding memory controllers with independent address buses decreases the above described memory-access granularity, requires more address pins, and reduces the data bandwidth D. The D-to-A ratio remains fixed. For example, 32 memory controllers are needed to reduce 256-byte granularity to 8 bytes per memory channel. Addressing GB-scale memory requires up to 32 bits for addressing. Theoretical limit for D is 67% of P (64 bits/(64 bits+32 bits)=67%). In reality, when the timing for addressing in typical DDR3 is considered, the actual data bandwidth D for computing tasks is below 50%.

In another design that is commonly seen in low-end processors in embedded systems, data and address buses are shared and reused alternately for data or addressing purposes over time. This type of processors has the benefit of simple packaging configuration with the total pin count close to the number needed for addressing only. However, since the D-to-A ratio is also fixed, this type of design has the same drawbacks as the previously described designs; it also cannot provide both addressing and data performances.

Other techniques have attempted to enhance the utilization of bandwidth by exploiting data locality, but have only achieved limited improvements. These techniques assume the conditions of fixed memory access granularity and constant D/A ratio. They depend on cache hierarchies to store perfected or to-be-reloaded data. However, cache is not scalable in multi-core processors: more processor cores in a multi-core processor results in smaller cache per processor core, which decreases hit rate. Moreover, during the short span of a cache, it is unlikely that the cache line acquired by one processor core happen to be requested by another processor core. As a result, caching becomes less effective when the number of processor cores is increased. In General Purpose Graphics Processing Unit (GPGPU), every 32 threads are grouped into a warp unit to execute vector instructions in a Single-Instruction Multi Data (SIMD). It enables, within a single task, alternate accesses to different memory addresses among multiple threads, without explicit data exchanges among threads in source codes, thus simplifying programming. But this approach is only effective for large data blocks each associated with continuous addresses (for GPGPU, 32 bytes typically). In practice, many processing tasks have data blocks less than 8 bytes with distributed memory addresses, which leads to very low data bus utilization. Consequently, although GPGPU technology can rarely double the performance of graphic computing (such as finding the shortest path between two points), even if it can speed up scientific computing by tens of times. In conclusion, if the D/A ratio is high at the processor-memory interface, data exchange within the multi-core processor can enhance data utilization and simplify coding, but cannot solve the problem of low memory bandwidth utilization in the presence of distributed access patterns.

There is therefore an urgent need for improving computing performance of multi-core processors in different types of computation applications.

SUMMARY OF THE INVENTION

The presently disclosed methods can significantly improve bandwidth utilization and increase computation performances in multi-core processors by adaptively configuring the data and address functions of processor pins and buses according to memory access granularity and the types of computation at hand. The disclosed methods also simplify program coding. By transferring only targeted words each time, the presently disclosed methods eliminate the needs for explicit data exchanges between processor cores. The disclosed methods are compatible with different multiplexer circuit designs between a multi-core processor and the memory chip(s). More importantly, contrary to cache, the presently disclosed methods are scalable with the scaling of processor cores in a chip.

In one general aspect, the present invention relates to a method of providing memory accesses for a multi-core processor. The method includes reserving a group of pins of a multi-core processor to transmit either data or address information in communication with one or more memory chips, wherein the multi-core processor comprises a plurality of processor cores; receiving memory access requests from the plurality of processor cores; determining granularity of the memory access requests by a memory controller; and dynamically adjusting, by the memory controller, a number of pins in the group of pins to be used to transmit address information based with the granularity of the memory access requests.

Implementations of the system may include one or more of the following. The step of adjusting can include decreasing the number of pins in the group of pins to be used to transmit address information by the memory controller when the granularity of the memory access requests increases. The memory access requests can be characterized as coarse-grained memory access requests if the memory access requests have data width equal or more than a predetermined data width, wherein the step of adjusting can include minimizing the number of pins in the group of pins to be used to transmit address information by the memory controller. The predetermined data width can be 32 bytes. The step of adjusting can include increasing the number of pins in the group of pins to be used to transmit address information by the memory controller when the granularity of the memory access requests decreases. The memory access requests can be characterized as fine-grained memory access requests if the memory access requests have data width equal or narrower than a predetermined data width, wherein the step of adjusting comprises maximizing the number of pins in the group of pins to be used to transmit address information by the memory controller. The predetermined data width can be 8 bytes. The method can further include bundling a plurality of fine-grained memory access requests having a same target memory address to form bundled fine-grained memory access requests; transmitting the target memory address via a set of pins in the group of pins in one or more address clock cycles; and after the step of transmitting the target memory address, transmitting data in the plurality of fine-grained memory access requests via the same set of pins in one or more data clock cycles following the one or more address clock cycles. The method can further include transmitting the target memory address in the one or more address clock cycles from the memory controller to a data multiplexer; controlling the data multiplexer by the memory controller to direct the target memory address to store in a latch; transmitting the target memory address from the latch to an address de-multiplexer; transmitting the target memory address from the address de-multiplexer to address input in the one or more memory chips; transmitting data in the fine-grained memory access requests to the data multiplexer; controlling the data multiplexer by the memory controller to direct the data in the fine-grained memory access requests to the memory chips following the one or more address clock cycles. The target memory address can be transmitted to the address input in the one or more memory chips one or more clock cycles after the target memory address is transmitted from the data de-multiplexer to the memory chips. The method can further include transmitting the target memory address in the one or more address clock cycles from the memory controller to a data multiplexer; controlling the data multiplexer by the memory controller to direct the target memory address to an address de-multiplexer; transmitting the target memory address from the address de-multiplexer to address input in the one or more memory chips; inserting one or more idle cycles after the one or more address clock cycles; transmitting data in the fine-grained memory access requests to the data multiplexer; controlling the data multiplexer by the memory controller to direct the data in the fine-grained memory access requests to the memory chips following the one or more idle clock cycles. The method can further include forming queues of memory access requests each associated with accessing data in one of the memory chips; bundling memory access requests in different queues that share same target addresses in two or more memory chips, which produces bundled memory access requests; simultaneously transmitting the memory addresses to the two or more memory chips associated with the bundled memory access requests; and after the step of simultaneously transmitting the memory addresses, simultaneously transmitting data in the bundled memory access requests to the respective memory chips at the memory address. The one or more memory chips can be outside of the multi-core processor.

BRIEF DESCRIPTION OF THE DRAWINGS

FIG. 1A is a timing diagram of consecutive reads in a conventional peripheral multiplexer circuit including a latch between a memory controller and one or more memory chips.

FIG. 1B is a timing diagram of consecutive reads with fine granularity in a peripheral multiplexer circuit including a latch between a memory controller and one or more memory chips in accordance with the present invention.

DETAILED DESCRIPTION OF THE INVENTION

Figure 2:
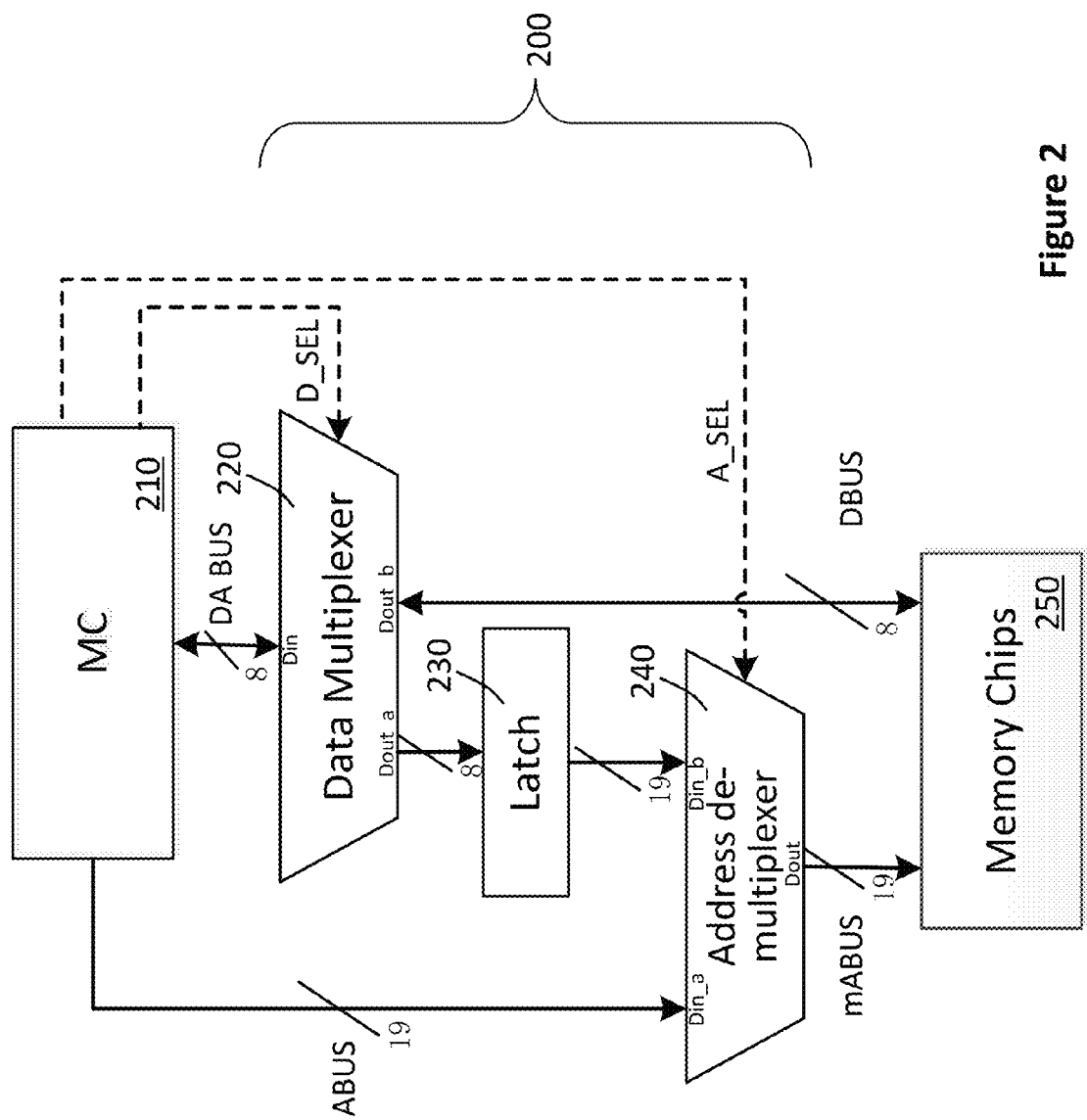
FIG. 2 is a system diagram for a peripheral multiplexer circuit for communications between a memory controller and one or more memory chips in accordance with the present invention.

Coarse-grained and fine-grain memory accesses are defined by relative sizes of the data widths. For example, coarse-grained memory accesses can involve data width greater than 32 bytes, while fine-grained memory accesses can have data width less than or equal to 8 bytes. The disclosed methods adaptively adjust shared address and data pins in multi-core processors according to the ratio of data and address flows. The disclosed multi-core processors can adaptively reduce address flow when the computation programs mainly involve coarse-grained memory accesses, and can increase address flow when the computation programs include fine-grained memory accesses.

The disclosed methods dynamically assigns pins with data or address functions according to the needs of computation program during runtime, which achieves high effective bandwidth utilizations in both coarse-grained accesses such as scientific computing applications, and find-grained accesses such as cloud computing or transaction-processing applications.

In the present disclosure, the term "processor core" refers to the smallest hardware unit in a multi-core processor that can process independent instructions in an instruction pipeline. The term "memory chip" refers to one or more banks of memory units outside of a processor core. A memory chip includes control logics for the columns and rows of memory units. The one or more banks of memory units share the same set of pins in communication with the processor core. The term "memory controller" refers to a circuit for controlling data streams that flow in and out of the memory chip. A memory controller also interprets address information issued by the processor core, buffers and adjusts memory access commands from the processor core(s), and issues read/write commands to a memory chip. The memory controller typically resides in the multi-core processor. The term "memory access" refers to the commands issued by the memory controller in the multi-core processor to read from or write to the external memory chip.

In some embodiments, the disclosed methods divide address and data pins of the processor-memory interface into several groups, each group of pins can perform data transfer or issue address information at any given clock cycle. The memory controller buffers memory requests from different processor cores in queues, aligns the memory requests to specific pins, and aggregates multiple memory access requests into bundled memory access requests in accordance with the pin groups. Since multiple memory accesses may be related to different addresses in a memory chip, the memory controller issues addresses to the shared pins in address cycles inserted before the respective memory access commands in the memory access sequence. At each cycle, the memory controller determines whether the address pins or the data pins of the memory chips are connected to the shared pins of the processor, and switch between address and data transfers accordingly. The memory controller is also responsible for decomposing the data retrieved from the memory chip, and sending them back to corresponding processor cores according their requests.

In the disclosed methods, when the processor cores request mainly coarse-grained memory accesses, the memory accesses are not aggregated, and the shared pins rarely transfer address information. The bandwidth utilization is similar to that of single memory controller with coarse-grained accesses. If the processor cores requests mostly fine-grained memory accesses at distributed memory addresses, address cycles are inserted into the command sequence and the bandwidth utilization is similar to that of multiple memory controllers with fine-grained accesses. The disclosed methods can therefore adaptively adjust the ratio of data transfer rate and address issue rate.

The disclosed methods can include one or more of the following steps:

1) The memory controller in the multi-core processor buffers memory requests from different processor cores in queues specific to different shared pins, and aggregates multiple memory accesses into a bundle.

2) The memory controller needs to issue multiple addresses through these shared pins ahead of time, i.e. inserting address cycles in the originally consecutive memory access commands.

3) The processor determines whether the address pins or the data pins of the memory chips are connected to the shared pins of the processor, and accordingly switches between address information issuing and data transferring.

4) The retrieved data is decomposed and returned to corresponding processor cores.

In some embodiments, in a first method, the internal structure and timing constraints of the memory chips (e.g. DDR3) are preserved. At every cycle, the memory controller dynamically switches between a single-issue coarse-grained mode and a multi-issue fine-grained mode according to the granularity of the memory access requests.

1. The memory controller inside processor groups every 8 pins into a pin group, which corresponds to a memory chip. For example, the minimum granularity is set to be 8 bytes for DDR3 memory chips that has a fixed burst length of 8.

a) Queue for coarse-grained memory requests
   The memory controller sets up an independent queue for coarse-grained memory requests, for example, those with memory access granularity equal or greater than 32 bytes. Their addresses are issued through specialized pins intended for addresses like the existing system.
   b) Queues for fine-grained memory accesses
   The memory controller sets up a queue for each pin. The memory controller aggregates fine-grained memory accesses into bundled memory accesses.
   c) Memory accesses with moderate granularity
   In some embodiments, memory accesses having moderate granularity between the fine-grained and coarse-grained memory accesses (e.g. greater than 8 bytes but smaller than 32 bytes) can decomposed into multiple fine-grained accesses with granularity at 8 bytes.
   d) Memory Commands
   The memory controller alternately selects coarse-grained accesses and fine-grained accesses, and issues corresponding commands to the memory chip.

2. At any given cycle, the shared pins and buses are only used as either for data or for address transfers. An originally consecutive data transfer may be appended by additional address cycles to allow memory access requests to be inserted.

FIG. 1A shows a timing diagram for multiple consecutive reads in a conventional peripheral multiplexer circuit including a latch between a memory controller and a memory chip. ABUS refers to the address bus between the memory controller and the memory chip(s). DBUS denotes the data bus. CL is the latency between column selection and data transfer. FIG. 1B shows a timing diagram of multiple consecutive reads with in the presently disclosed methods. ABUS represents the address bus of memory chips. DA BUS denotes the shared bus. The shared bus latches the inserted address at the inserted address cycles, and issues the latched address at the next two system cycles.

In some embodiments, referring to FIG. 1B which shows a timing diagram of consecutive reads with fine granularity in a peripheral multiplexer circuit including a latch, the row selection signal of the (i+1)-th access and the column selection signal of the (i−1)-th access are set at neighboring cycles, stored by the latch, and issued approximately two cycle later onto mABUS from the latch to the address pins of the corresponding memory chips.

The switches between read and write cycles in DDR3 include latencies and time skews of rising and falling edges between the memory controller and the memory chips. Therefore, the trigger edges of the input of the latch should align with the current data bus edges at the inserted two address cycles, while the output edges should align with the edges of the address bus of the memory chips.

3. The processor determines whether the address pins or the data pins of the memory chips are connected to the shared pins of the processor, and accordingly switches between issuing address and data from the processor.

The data pins and address pins are shared, in contrast to data pins and address pins assigned with distinctly separate tasks in conventional system. One or more peripheral latches and (de-)multiplexers are implemented between the memory chips and the memory controller. The existing address bus is preserved for coarse-grained accesses. For bundled memory access requests aggregated from fine-grained accesses, different addresses are issued for different groups of pins and store the addresses in latches, which are subsequently sent to corresponding memory chips in accordance with the timing diagram above. Extra control signals are required to manage the (de-)multiplexers.

Referring to FIG. 2, a peripheral logic circuit 200 includes a data multiplexer 220, an address de-multiplexer 240, and a latch 230 for controlling memory accesses between a memory controller 210 and one or more memory chip(s) 250. The memory controller 210 and the data multiplexer 220 are connected via a data bus DA BUS. The data multiplexer 220 has an input Din connected to DA BUS, an output pin Dout_a connected to the input of the latch 230, and another output Dout_b connected to the data pins of memory chip(s) 250.

The latch 230 is connected to an input Din_b of the address de-multiplexer 240. The address de-multiplexer 240 has another input Din_a connected to the memory controller 210 via address bus ABUS. The address de-multiplexer 240 has output Dout connected to the address pins of the memory chip(s) 250 via mABUS. The memory controller 210 can issue additional select signal D_SEL to the data multiplexer 220 and select signal A_SEL to the address de-multiplexer 240.

The memory controller 210 is typically in a multi-core processor (not shown). The memory chip(s) 250 are outside of the multi-core processor (not shown). In some embodiments, the peripheral circuit can be integrated within the memory chips.

When the memory chips 250 issues coarse-grained requests in addressing cycles via the address bus ABUS, D_SEL switches the data multiplexer 220 to Dout_b, therefore bypassing the latch 230. A_SEL selects Din_a in the address de-multiplexer 240, which connects the address bus ABUS to the memory chips 250 via mABUS (also bypassing the latch 230). For the coarse-grained memory requests, the data and address configurations are similar to existing multi-core memory systems. Addresses are issued from independent address bus ABUS similar to the timing diagram in FIG. 1A. The peak data bandwidth is close to P.

When the memory chips 250 issues fine-grained requests, referring to FIG. 1B and 2, D_SEL switches the data multiplexer 220 to Dout_a and A_SEL selects Din_b, which directs the communications between the memory controller 210 and the memory chips 250 via the latch 230. At a single address cycle, the latch 230 can receive a total of 32 bits address information at the four rising the falling edges (double data rate), which can include 19 bits for the (i+1)-th row selection and 10 bits for the (i−1)-th column selection. The latch 230 stores the address information and outputs them two clock cycles later. For the fine-grained memory requests, the memory access patterns are irregular and distributed.

Figure 3:
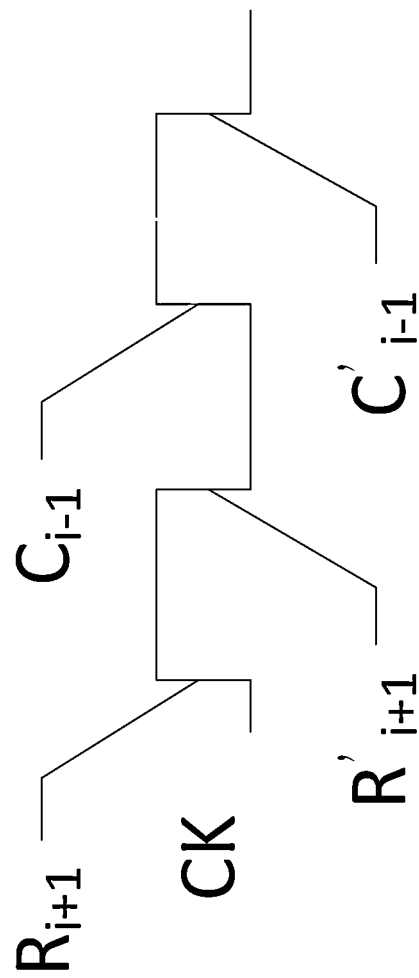
FIG. 3 is a timing diagram illustrating consecutively inserted addresses relative to system clock cycles in accordance with the present invention.

As shown in FIGS. 1B and 3, both address information and data in the fine-grained requests are transmitted through the DA BUS from the memory controller 210 to the data multiplexer 220. The target address in the memory chip 250 is inserted in two address clock cycles ("R" and "C") before their respective data clock cycles in the DA BUS. The address information is extracted by the data multiplexer and stored in in the latch 230. The address information is sent from the latch 230 to the memory chip 250 via the address de-multiplexer 240 after a delay. Data in the fine-grained requests is also extracted by the data multiplexer, and transmitted to the memory chip 250 in data clock cycles after the memory chips 250 are properly addressed by the address information. In this example shown in FIG. 1B, the peak data bandwidth is limited to a maximum of 0.67P (4/(3+3)=0.67).

4. The retrieved data is de-composed and returned to corresponding processor cores.

The issued requests are still stored in the memory controller 210 in a waiting state. When the data is returned in response to the bundled find-gained memory accesses, the memory controller 210 breaks the data according to the original requests from different processor cores, and sends data packets the registers in the corresponding processor cores. Thus, each request is expected to contain information about the target memory addresses, operations, and the processor cores' identifications, registers identifications, etc.

In some embodiments, a redundant checksum can be implemented as an Error-Correcting Code (ECC) function for fine-grained memory accesses in the presently disclosed method to ensure Quality of Service.

In some embodiments, a second method discloses a latch-free peripheral logic circuit to facilitate communication between memory controller and memory chips. Without a latch, the peripheral logic circuit does not contain memory functions. The address information transferred the shared bus and the pins must strictly follow the timing sequence of the addresses in the memory chips. Each memory chip requires at least 16 buses for the address selections of rows and columns. In one implementation, 16 pins of the processor are grouped in a pin group, which connects two memory chips, which can be called up-chip and down-chip.

To make full use of the bandwidth capability, all up-chips are triggered by the system clock CK and data selection DQS (Data Quality Service), the address information is latched at the rising edges; all down-chips function at the counter system clock CK# and counter data selection DQS#, the address information is latched at the falling edges. FIG. 3 shows two neighboring address cycles, the two rising edges $R_{i+1}$, $C_{i-1}$ are respectively used to trigger the (i+1)-th row selection and the (i−1)-th column selection for the up-chips while the two falling edges $R'_{i+1}$, $C'_{i-1}$ are used to trigger the (i+1)-throw selection and the (i−1)-th column selection for the down-chips.

Figure 5:
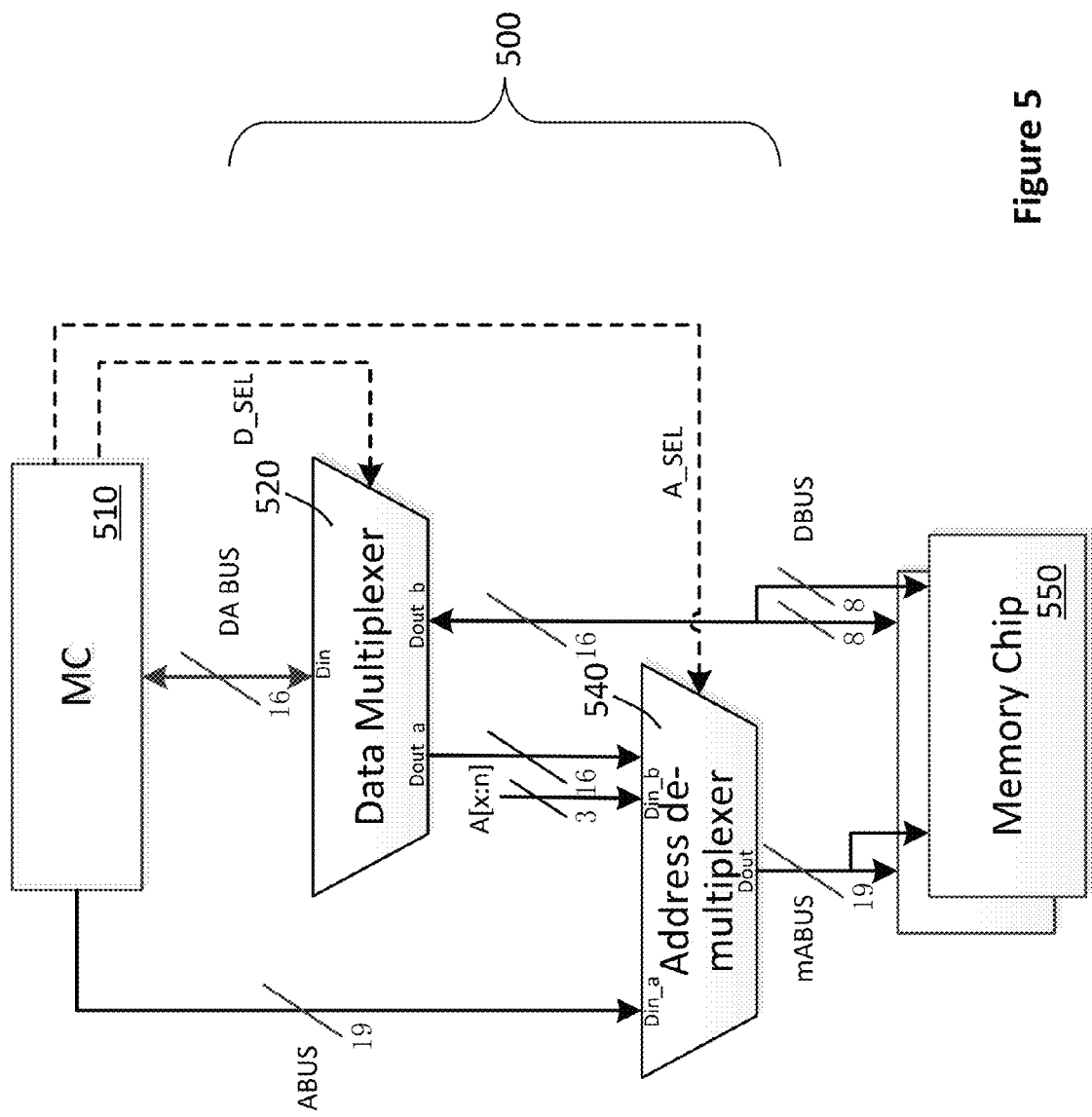
FIG. 5 is another system diagram for a peripheral multiplexer circuit for communications between a memory controller and one or more memory chips in accordance with the present invention.

Referring to FIG. 5, a latch-free peripheral logic circuit 500 includes a data multiplexer 520, and an address de-multiplexer 540 that controls memory accesses between a memory controller 510 and one or more memory chip(s) 550 via mABUS. Unlike the first method, there is no latch in the peripheral logic circuit 500. In some implementations, every 16 shared pins of the memory controller 510 are grouped and connected to the data multiplexer 520, and in turn to the address de-multiplexer 540 and then to the data pins of the two memory chips 550 (8 for each). In the address cycles, DA BUS is connected to the address de-multiplexer 540 which is selected by the A_SEL signal to connect to the memory chip(s) 550 via mABUS. In the normal data transferring cycles, DA BUS is selected by the D_SEL signal from the memory controller 510 to connect to the data pins of the memory chips 550. Since 19 bits are required for row addresses and there are only 16 bits in a group, 3 bits are borrowed from the spare original address bus.

Figure 4A:
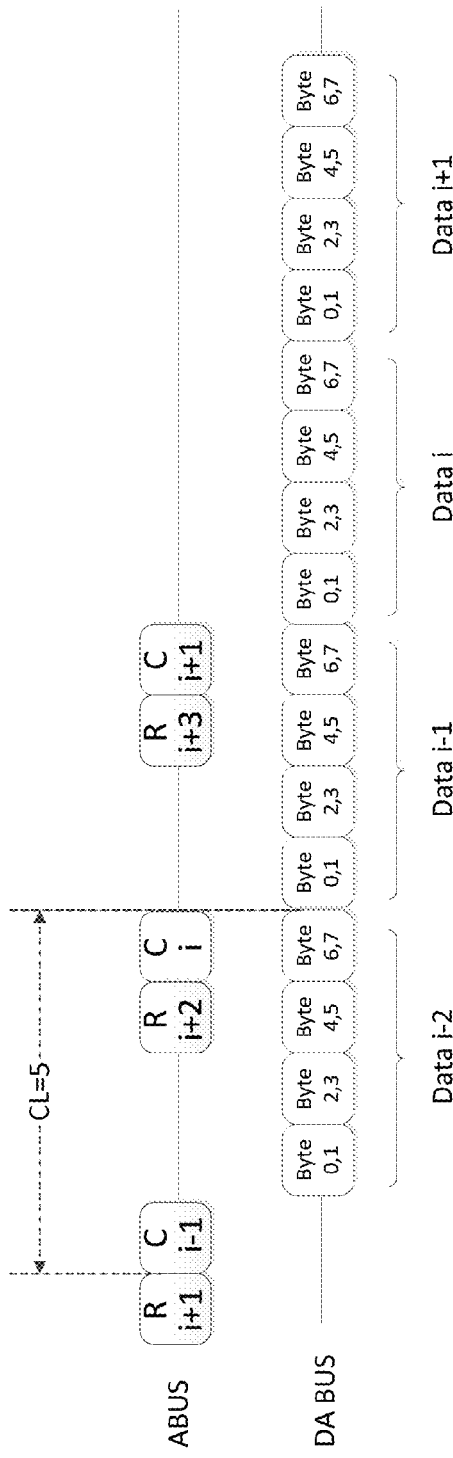
FIG. 4A is a timing diagram of consecutive reads in a conventional peripheral multiplexer circuit without a latch between a memory controller and one or more memory chips.

If most of the requests are coarse-grained, the second method is similar to the first method or existing multi-core systems. FIG. 4A shows a timing diagram for multiple consecutive reads in a conventional peripheral multiplexer circuit without a latch between a memory controller and a memory chip, similar to that shown in FIG. 1A. Addresses are issued from the memory controller 510 to the address de-multiplexer 540 via the independent address bus ABUS and then the memory chip 550 via mABUS according to timing diagram in FIG. 4A. The peak data bandwidth is close to P.

Otherwise, if most of the memory-access requests are fine-grained, the access patterns are irregular and distributed. The operation procedure is executed according to timing diagram in FIG. 4B which shows a timing diagram of consecutive reads with fine granularity in a peripheral multiplexer circuit without a latch between a memory controller and one or more memory chips. Three cycles are inserted before every data transfer burst. In this example shown in FIG. 4B, the peak data bandwidth is close to 0.57P (4/(3+4)=0.57).

Figure 4B:
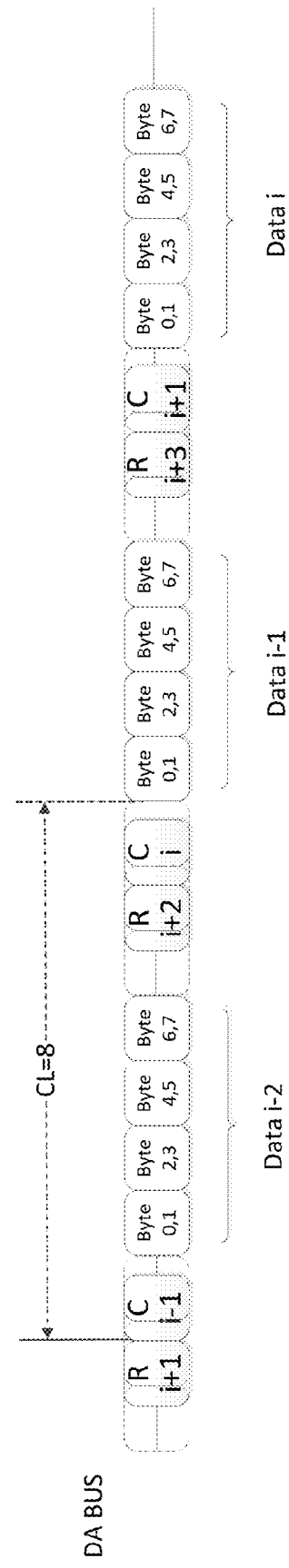
FIG. 4B is a timing diagram of consecutive reads with fine granularity in a peripheral multiplexer circuit without a latch between a memory controller and one or more memory chips in accordance with the present invention.

For fine grained memory access requests, memory access request having the same target addresses are bundled. Both address information and data in the fine-grained requests are transmitted from the memory controller 510 through the DA BUS to the data multiplexer 520. Similar to the operations described above in relation to FIGS. 1B and 3, address information (i.e. row and column selection signals) are inserted before their associated data signals as shown in FIG. 4B. In addition, an idle cycle is inserted between the address clock cycles ("R" and "C" in FIG. 4B) and read and write operations in the data clock cycles because the timing for the write command is a little ahead of the read timing in the memory chip(s). Regardless whether it is a read or a write operation, the additional idle cycles assure that the up chip and the down chip are synchronized, and the addresses are issued strictly according to the chronicle sequence of the addresses in the memory chip(s). In some implementations, the memory chip(s) require a minimum of 5 clock cycles between selection and associated data transfer. In the second method, the address selections and the idle cycles increase the minimum number of cycles per data transfer to 8. The timing of the addressing and data operations shown in FIG. 4B are controlled by D_SEL and A_SEL control signals from the memory controller 510. In the address clock cycles, D_SEL directs address information from Dout_a of the data multiplexer 520 to the address de-multiplexer 540. The address information (e.g. column and row numbers) is then sent to the memory chip 550 via mABUS under the control of A_SEL signal. One or more idle cycles are inserted. In the data clock cycles, D_SEL switches the data multiplexer 520 to Dout_b for read and write operations in the bundled memory access requests in communications with the memory chip 550.

The focuses of the above described methods are to provide solutions for coarse-grained and find-grained memory-access requests. For memory-access requests of moderate granularities (e.g. data width from 8 bytes to 32 bytes), the requests are broken down to fine-grained ones, which is simple to implement logically but also has the drawback of sending redundant addresses.

Figure 7:
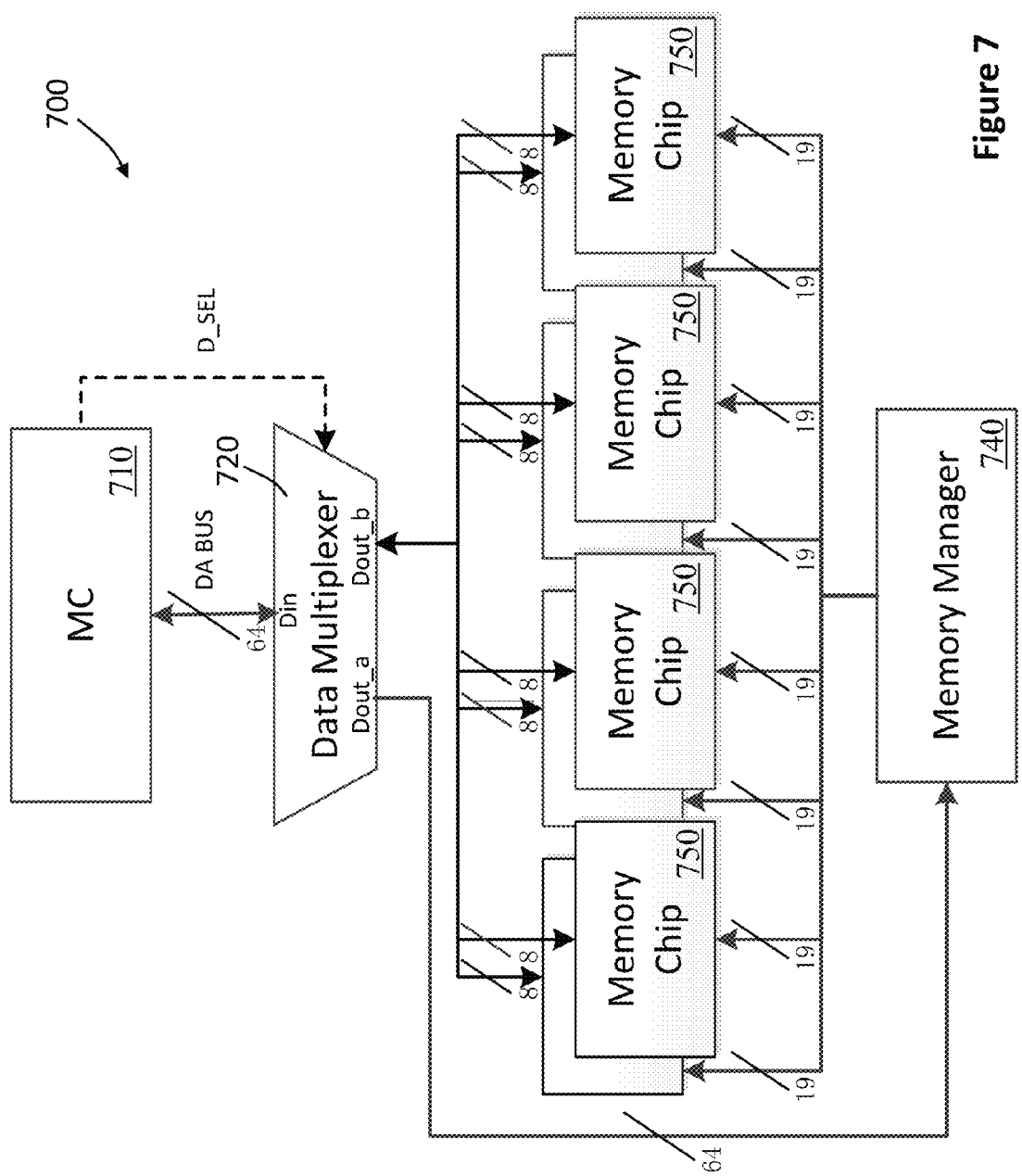
FIG. 7 illustrates a peripheral multiplexer circuit including a memory manager for communications between a memory controller and one or more memory chips in relation to FIG. 6.

In some embodiments, referring to FIG. 7, in a third method, a peripheral logic circuit 700 includes a data multiplexer 720, and a memory manager 740 for controlling memory accesses between a memory controller 710 and one or more memory chip(s) 750. The memory manager 740 performs the functions of buffering, recording, and issuing commands according to timing constraints. A unified address bus is no longer required and all addresses are issued through the DA BUS. All lines (e.g. 64 lines) of DA BUS are connected to the data multiplexer 720. The data multiplexer 720 can direct the data or address information respectively to output Dout_a or Dout_b in response to the control signal D_SEL issued by the memory controller 710. Dout_a is connected to the address input of the memory manager 740. Dout_b is connected to the data pins of the memory chips 750. The output of the memory manager 740 is connected to the address pins of the memory chips 750.

Memory-access requests of different data widths are queued up with each memory chip associated with a queue. A memory-access request can specify information about memory address, data width, and a write/read operation.

Figure 6:
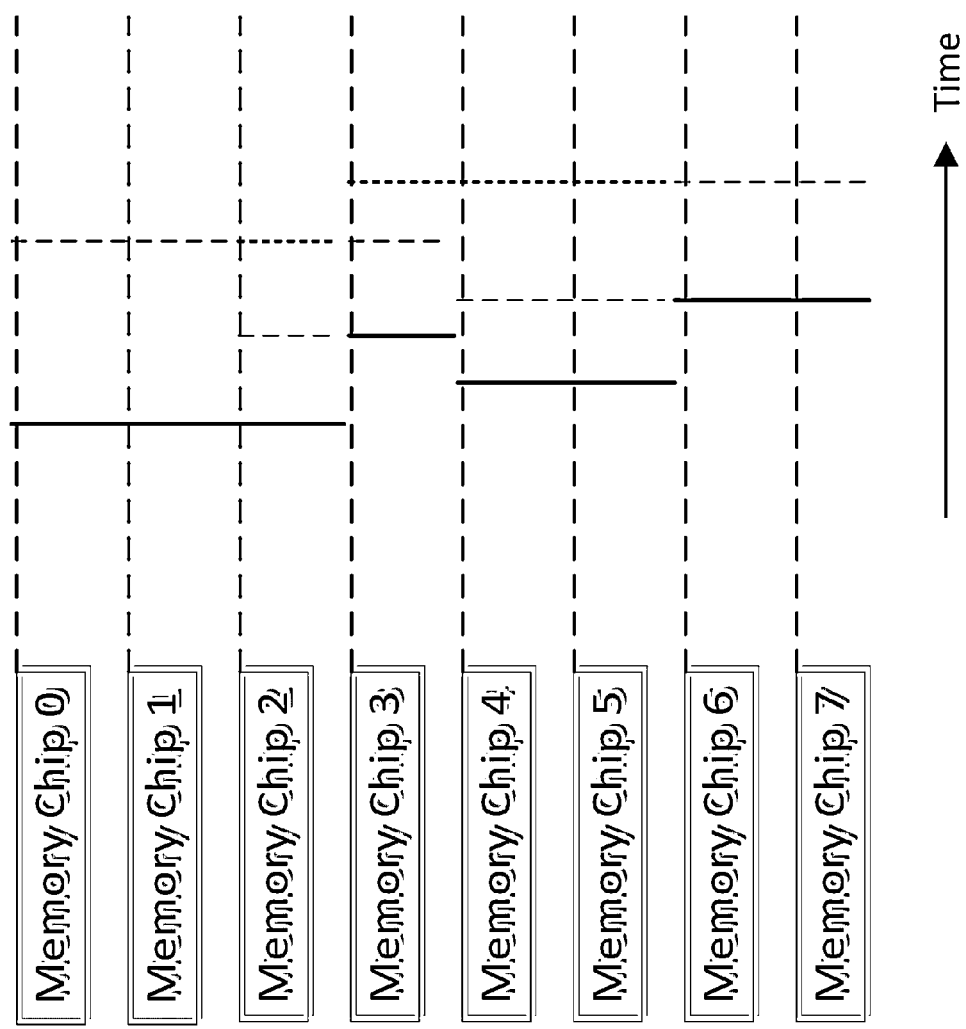
FIG. 6 is a schematic diagram for splicing memory accesses having a medium granularity.

The Greedy algorithm is used to optimize compact memory accesses locally in order to achieve global optimum. Referring to FIGS. 6 and 7, the memory controller 710 identifies the first memory-access requests to the memory chips 750 in their respective queues, and aggregates them into the widest-possible bundled requests. If two memory-access requests include an overlap portion, the latter portion is separated and kept in the queue. In FIG. 6, each memory chip 0-7 is associated with a queue as indicated by a horizontal dashed line. The vertical lines running across different queues represent bundled requests. For example, the first vertical line on the upper left aggregates memory-access requests in the three queues associated with memory chips 0, 1, 2. The memory-access requests illustrated are of a medium granularity (i.e. the bundling is not across all memory chips or limited to a single memory chip). Each bundle of memory accesses needs to be issued with only one group of memory addresses in the memory chip. The number of memory addresses is equal to the number of request bundles (not the number of memory-access requests).

Because the memory manager 740 includes buffer function, bundled memory-access requests can be issued in consecutive address cycles by the memory controller 710 through the DA BUS to the memory manager 740. At address cycles, D_EL switches the data multiplexer 720 to Dout_a. A batch of addresses are transmitted together and buffered in the memory manager 740. After address transfer, the memory manager 740 issues the addresses to the memory chips 750 strictly according to timing constraints. D_SEL then switches the data multiplexer 720 to Dout_b for data transfers to and from the memory chips 750. For memory access requests of moderate granularities, the memory manager 740 issues the same memory address simultaneously to all associated memory chips 750 in each bundled memory request. With such a batch operation, data transfer cycles are not interrupted by the address cycles. Afterwards, the read and write data operations are also conducted in parallel (simultaneously) to and from the relevant memory chips 750 via the data multiplexer 720.

For a complete memory-access request, the memory controller 710 returns the acquired data to the appropriate processor cores that requested them. For the segmented memory-access requests, the memory controller 710 buffers different portions and recombines the data before the data is returned to the corresponding processor core.

As a variant to the above described lock-step modes in the third method, a mixed-cycle mode can include part of the DA BUS designated for data transferring while the rest of the DA BUS used for issuing addresses to the memory manager.

The bandwidth utilization of the third method is at least as good as the first and the second methods regardless it is in a coarse-grained mode or a fine-grained mode, while when there are memory-access requests with moderate granularities, its utilization could be slightly better than the above embodiments because of a reduce in address information issued from the processor.

Only a few examples and implementations are described. Other implementations, variations, modifications and enhancements to the described examples and implementations may be made without deviating from the spirit of the present invention. For example, the disclosed system, methods, applications, and user interfaces can be implemented using hardware or software other than the examples described above.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

It will thus be seen that the objects of the present invention have been fully and effectively accomplished. Its embodiments have been shown and described for the purpose of illustrating the functional and structural principles of the present invention and is subject to change without departure from such principles. Therefore, this invention includes all modifications encompassed within the spirit and scope of the following claims.

What is claimed is:

1. A method of providing memory accesses for a multi-core processor, comprising:
    reserving a group of pins of a multi-core processor to transmit either data or address information in communication with one or more memory chips, wherein the multi-core processor comprises a plurality of processor cores;
    receiving memory access requests from the plurality of processor cores;
    determining granularity of the memory access requests by a memory controller;
    dynamically adjusting, by the memory controller, a number of pins in the group of pins to be used to transmit address information based with the granularity of the memory access requests,
    forming queues of memory access requests each associated with accessing data in one of the memory chips;
    bundling memory access requests in different queues that share same target addresses in two or more memory chips, which produces bundled memory access requests;
    simultaneously transmitting the memory addresses to the two or more memory chips associated with the bundled memory access requests; and
    after the step of simultaneously transmitting the memory addresses, simultaneously transmitting data in the bundled memory access requests to the respective memory chips at the memory address.

2. The method of claim 1, wherein the step of adjusting comprises:
    decreasing the number of pins in the group of pins to be used to transmit address information by the memory controller when the granularity of the memory access requests increases.

3. The method of claim 1, wherein the memory access requests are characterized as coarse-grained memory access requests if the memory access requests have data width equal or more than a predetermined data width, wherein the step of adjusting comprises minimizing the number of pins in the group of pins to be used to transmit address information by the memory controller.

4. The method of claim 3, wherein the predetermined data width is 32 bytes.

5. The method of claim 1, wherein the step of adjusting comprises:
    increasing the number of pins in the group of pins to be used to transmit address information by the memory controller when the granularity of the memory access requests decreases.

6. The method of claim 1, wherein the memory access requests are characterized as fine-grained memory access requests if the memory access requests have data width equal or narrower than a predetermined data width, wherein the step of adjusting comprises maximizing the number of pins in the group of pins to be used to transmit address information by the memory controller.

7. The method of claim 6, wherein the predetermined data width is 8 bytes.

8. The method of claim 6, further comprising:
    bundling a plurality of fine-grained memory access requests having a same target memory address to form bundled fine-grained memory access requests;
    transmitting the target memory address via a set of pins in the group of pins in one or more address clock cycles; and
    after the step of transmitting the target memory address, transmitting data in the plurality of fine-grained memory access requests via the same set of pins in one or more data clock cycles following the one or more address clock cycles.

9. The method of claim 8, further comprising:
    transmitting the target memory address in the one or more address clock cycles from the memory controller to a data multiplexer;
    controlling the data multiplexer by the memory controller to direct the target memory address to store in a latch;
    transmitting the target memory address from the latch to an address de-multiplexer;
    transmitting the target memory address from the address de-multiplexer to address input in the one or more memory chips;
    transmitting data in the fine-grained memory access requests to the data multiplexer; and
    controlling the data multiplexer by the memory controller to direct the data in the fine-grained memory access requests to the memory chips following the one or more address clock cycles.

10. The method of claim 9, wherein the target memory address is transmitted to the address input in the one or more memory chips one or more clock cycles after the target memory address is transmitted from the data de-multiplexer to the memory chips.

11. The method of claim 8, further comprising:
    transmitting the target memory address in the one or more address clock cycles from the memory controller to a data multiplexer;
    controlling the data multiplexer by the memory controller to direct the target memory address to an address de-multiplexer;
    transmitting the target memory address from the address de-multiplexer to address input in the one or more memory chips;
    inserting one or more idle cycles after the one or more address clock cycles;
    transmitting data in the fine-grained memory access requests to the data multiplexer; and
    controlling the data multiplexer by the memory controller to direct the data in the fine-grained memory access requests to the memory chips following the one or more idle clock cycles.

12. The method of claim 1, wherein the one or more memory chips are outside of the multi-core processor.

13. A method of providing memory accesses for a multi-core processor, comprising:
    reserving a group of pins of a multi-core processor to transmit either data or address information in communication with one or more memory chips, wherein the multi-core processor comprises a plurality of processor cores;
    receiving memory access requests from the plurality of processor cores;
    determining granularity of the memory access requests by a memory controller; and
    dynamically adjusting, by the memory controller, a number of pins in the group of pins to be used to transmit address information based with the granularity of the memory access requests, wherein the step of dynamically adjusting comprises:
  decreasing the number of pins in the group of pins to be used to transmit address information by the memory controller when the granularity of the memory access requests increases;
increasing the number of pins in the group of pins to be used to transmit address information by the memory controller when the granularity of the memory access requests decreases,
forming queues of memory access requests each associated with accessing data in one of the memory chips;
bundling memory access requests in different queues that share same target addresses in two or more memory chips, which produces bundled memory access requests;
simultaneously transmitting the memory addresses to the two or more memory chips associated with the bundled memory access requests; and
after the step of simultaneously transmitting the memory addresses, simultaneously transmitting data in the bundled memory access requests to the respective memory chips at the memory address.

* * * * *